(12) United States Patent
Kim et al.

(10) Patent No.: US 8,053,822 B2
(45) Date of Patent: Nov. 8, 2011

(54) CAPACITORLESS DRAM AND METHODS OF MANUFACTURING AND OPERATING THE SAME

(75) Inventors: Suk-pil Kim, Yongin-si (KR); Young-gu Jin, Hwaseong-si (KR); Yoon-dong Park, Yongin-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 104 days.

(21) Appl. No.: 12/153,666

(22) Filed: May 22, 2008

(65) Prior Publication Data

US 2009/0065835 A1 Mar. 12, 2009

(30) Foreign Application Priority Data

Sep. 11, 2007 (KR) .................. 10-2007-0092149

(51) Int. Cl.
*H01L 27/108* (2006.01)
(52) U.S. Cl. ............... 257/296; 257/314; 257/E29.001; 257/E21.409; 257/E21.646; 257/E27.086; 438/197; 438/257; 365/184

(58) Field of Classification Search .................. 257/296, 257/314, E27.086, E21.646, E29.001, E21.409; 438/257, 197; 365/184
See application file for complete search history.

(56) References Cited

U.S. PATENT DOCUMENTS

| | | | | |
|---|---|---|---|---|
| 2005/0017240 A1* | 1/2005 | Fazan | ............. | 257/59 |
| 2005/0260798 A1* | 11/2005 | King | ............. | 438/142 |
| 2007/0200178 A1* | 8/2007 | Yun et al. | ............. | 257/353 |
| 2009/0026519 A1* | 1/2009 | Jin et al. | ............. | 257/314 |

\* cited by examiner

*Primary Examiner* — Lynne Gurley
*Assistant Examiner* — Naima Kearney
(74) *Attorney, Agent, or Firm* — Harness, Dickey & Pierce, P.L.C.

(57) ABSTRACT

Example embodiments provide a capacitorless dynamic random access memory (DRAM), and methods of manufacturing and operating the same. The capacitorless DRAM according to example embodiments may include a semiconductor layer separated from a top surface of a substrate and that contains a source region, a drain region, and a channel region, a charge reserving layer formed on the channel region, and a gate formed on the substrate to contact the channel region and the charge reserving layer.

28 Claims, 7 Drawing Sheets

CAPACITORLESS DRAM AND METHODS OF MANUFACTURING AND OPERATING THE SAME

FOREIGN PRIORITY STATEMENT

This application claims priority under 35 U.S.C. §119 to Korean Patent Application No. 10-2007-0092149, filed on Sep. 11, 2007, in the Korean Intellectual Property Office, the entire contents of which are incorporated herein by reference.

BACKGROUND

1. Field

Example embodiments are directed a semiconductor device and methods of manufacturing and operating the same, and more particularly, to a capacitorless dynamic random access memory (DRAM) and methods of manufacturing and operating the same.

2. Description of Related Art

A memory cell of a conventional dynamic random access memory (DRAM), may have a 1T/1C structure including one transistor and one capacitor. It may be difficult to reduce a cell area of the conventional DRAM including both the transistor and the capacitor.

In order to scale down conventional DRAMs, a DRAM that may store data with a transistor and without a capacitor, that is, a capacitorless 1T DRAM, has been suggested. The capacitorless 1T DRAM, hereinafter referred to as a conventional capacitorless DRAM, may include a channel that is electrically floated.

FIG. 1 illustrates a conventional capacitorless DRAM.

Referring to FIG. 1, a gate 200 may be formed on a silicon-on-insulator (SOI) substrate 100 that has a structure in which a first silicon layer 10, an oxide layer 20, and a second silicon layer 30 are sequentially stacked. The gate 200 may be formed of a gate insulating layer 40 and a gate conductive layer 50 sequentially stacked on the second silicon layer 30. A source 30a and a drain 30b may be formed in the second silicon layer 30 on both sides of the gate 200. The source 30a and the drain 30b of the second silicon layer 30 may be silicon layers doped with n-type impurities of high density. A floating channel body 30c that is electrically separated from the first silicon layer 10 by the oxide layer 20 may be formed between the source 30a and the drain 30b. The floating channel body 30c may be a p-type silicon layer and may function as data storage. Because the floating channel body 30c may display different electric resistances in a state of the floating channel body 30c where excess holes are accumulated (hereinafter, a first state) and a state where no excess holes are accumulated (hereinafter, a second state), the first and second states may correspond to data '1' and '0', respectively.

However, the data retention characteristics of the floating channel body 30c in the conventional capacitorless DRAM may not be desirable. For example, because a broad area of the floating channel body 30c contacts with the source 30a and the drain 30b in the conventional capacitorless DRAM, charges may leak at the junction areas therebetween. Accordingly, the data retention time in the floating channel body 30c may be reduced.

In addition, since the conventional capacitorless DRAM is formed on the expensive SOI substrate 100, increased manufacturing costs may be incurred.

SUMMARY

Example embodiments are directed to a capacitorless dynamic random access memory (DRAM) that may have improved data retention characteristics, and which may result in decreased manufacturing costs.

Example embodiments also provide a method of manufacturing the capacitorless DRAM.

Example embodiments also provide a method of operating the capacitorless DRAM.

Example embodiments provide a capacitorless dynamic random access memory (DRAM) that may include a semiconductor layer separated from a top surface of a substrate and containing a source region, a drain region, and a channel region, a charge reserving layer formed on the channel region, and a gate formed on the substrate that may contact the channel region and the charge reserving layer.

The channel region may protrude over the source region and the drain region, and the charge reserving layer may be separated from the source region and the drain region.

The gate may cover both side surfaces of the channel region, and both side surfaces and a top surface of the charge reserving layer.

The valence band of the charge reserving layer may be higher than the valence band of the channel region.

The channel region may be an intrinsic semiconductor region or a p-semiconductor region.

The doping density of the charge reserving layer may be higher than the doping density of the channel region.

The charge reserving layer may be a p-type semiconductor layer.

The charge reserving layer may be a p+ semiconductor layer.

The substrate may be a Si substrate.

The semiconductor layer may be a Si layer.

Example embodiments provide a method of manufacturing a capacitorless DRAM that may include forming a stack pattern including a sacrificial layer, a semiconductor layer, and a charge reserving layer sequentially stacked on a substrate, forming a gate material layer covering the stack pattern on the substrate, exposing both ends of the stack pattern by patterning the gate material layer, removing the charge reserving layer, and the semiconductor layer to a predetermined thickness from the both ends of the stack pattern, forming a source region and a drain region respectively in the remaining portions of the semiconductor layer of the both ends of the stack pattern, and removing the sacrificial layer.

Example embodiments of forming a stack pattern may include providing the substrate including the sacrificial layer on the upper portion of the substrate, forming the semiconductor layer on the sacrificial layer, changing the upper portion of the semiconductor layer into the charge reserving layer, and patterning the charge reserving layer, the semiconductor layer, and the sacrificial layer.

Example embodiments of forming a stack pattern may include forming the substrate including the sacrificial layer on the upper portion of the substrate, forming the semiconductor layer on the sacrificial layer, forming the charge reserving layer on the semiconductor layer, and patterning the charge reserving layer, the semiconductor layer, and the sacrificial layer.

The substrate may be a Si substrate.

The sacrificial layer may be a SiGe layer.

The sacrificial layer may be formed by an epitaxial growth method.

The sacrificial layer may be formed by implanting Ge ions in the upper portion of the substrate and then annealing the upper portion implanted with the Ge ions.

The semiconductor layer may be formed of Si.

The charge reserving layer may be formed by implanting p-type impurities in the upper portion of the semiconductor layer.

A channel region formed between the source region and the drain region may protrude over the source region and the drain region, and the charge reserving layer may be separated from the source region and the drain region.

The valence band of the charge reserving layer may be higher than the valence band of a channel region between the source region and the drain region.

The channel region may be an intrinsic semiconductor region or a p-semiconductor region.

The charge reserving layer may be a p-type semiconductor layer.

Example embodiments provide a method of operating a capacitorless DRAM that may include applying a voltage to the source region, the drain region, and the gate.

The voltage may be one of a data writing voltage, a data reading voltage, and a data erasing voltage.

Data may be written by accumulating holes in the charge reserving layer. The impact of electrons may generate pairs of electro-holes in the charge reserving layer. The tunneling of electrons may generate holes in the charge reserving layer.

Data may be erased by removing holes accumulated in the charge reserving layer.

BRIEF DESCRIPTION OF THE DRAWINGS

The above and other features and advantages of example embodiments will become more apparent by describing in detail example embodiments with reference to the attached drawings. The accompanying drawings are intended to depict example embodiments and should not be interpreted to limit the intended scope of the claims. The accompanying drawings are not to be considered as drawn to scale unless explicitly noted.

DETAILED DESCRIPTION

Figure 1:
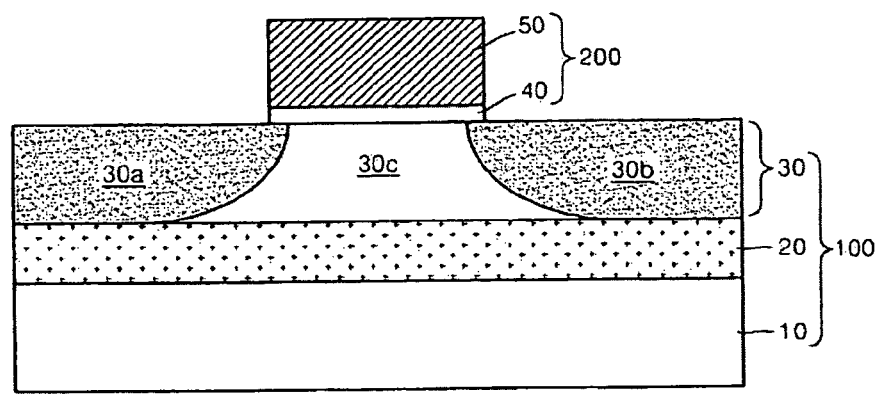
FIG. 1 is a cross-sectional view of a conventional capacitorless dynamic random access memory (DRAM).

Detailed example embodiments are disclosed herein. However, specific structural and functional details disclosed herein are merely representative for purposes of describing example embodiments. Example embodiments may, however, be embodied in many alternate forms and should not be construed as limited to only the embodiments set forth herein.

Accordingly, while example embodiments are capable of various modifications and alternative forms, embodiments thereof are shown by way of example in the drawings and will herein be described in detail. It should be understood, however, that there is no intent to limit example embodiments to the particular forms disclosed, but to the contrary, example embodiments are to cover all modifications, equivalents, and alternatives falling within the scope of example embodiments. Like numbers refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments. As used herein, the term "and/or" includes any and all combinations of one or more of the associated listed items.

It will be understood that when an element is referred to as being "connected" or "coupled" to another element, it may be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between", "adjacent" versus "directly adjacent", etc.).

The terminology used herein is for the purpose of describing particular embodiments only and is not intended to be limiting of example embodiments. As used herein, the singular forms "a", "an" and "the" are intended to include the plural forms as well, unless the context clearly indicates otherwise. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

Figure 2:
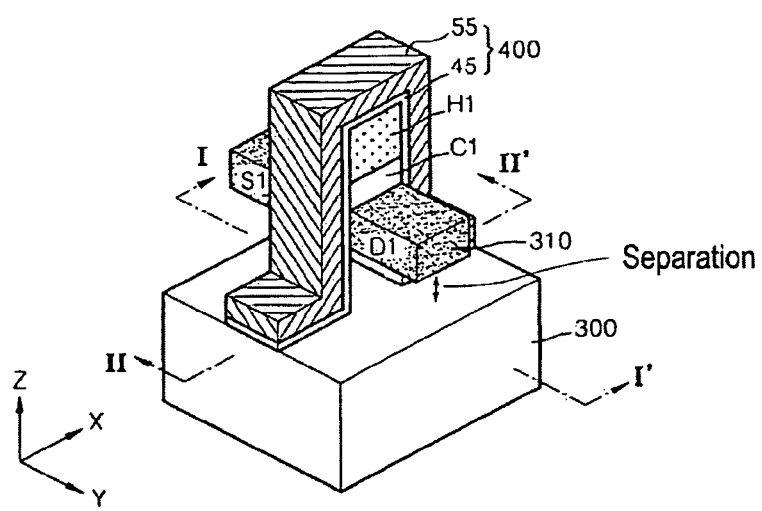
FIG. 2 is a perspective view of a capacitorless DRAM according to example embodiments.
Figure 3:
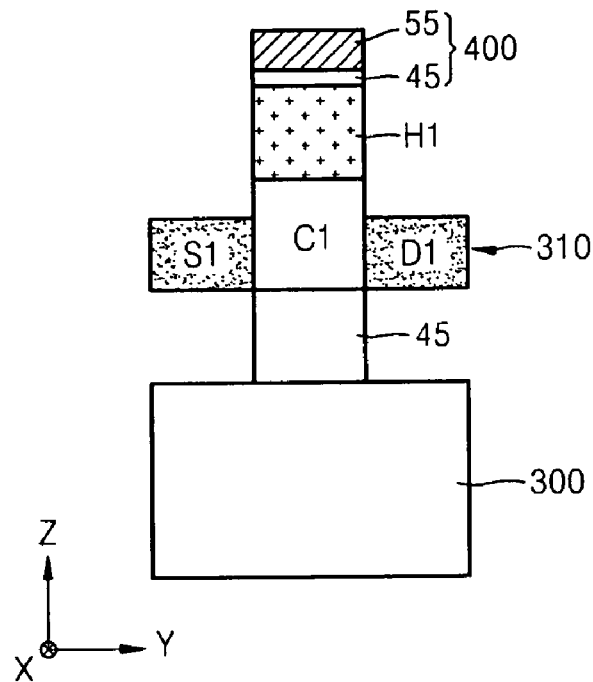
FIG. 3 is a cross-sectional view of taken along line I-I' of FIG. 2.
Figure 4:
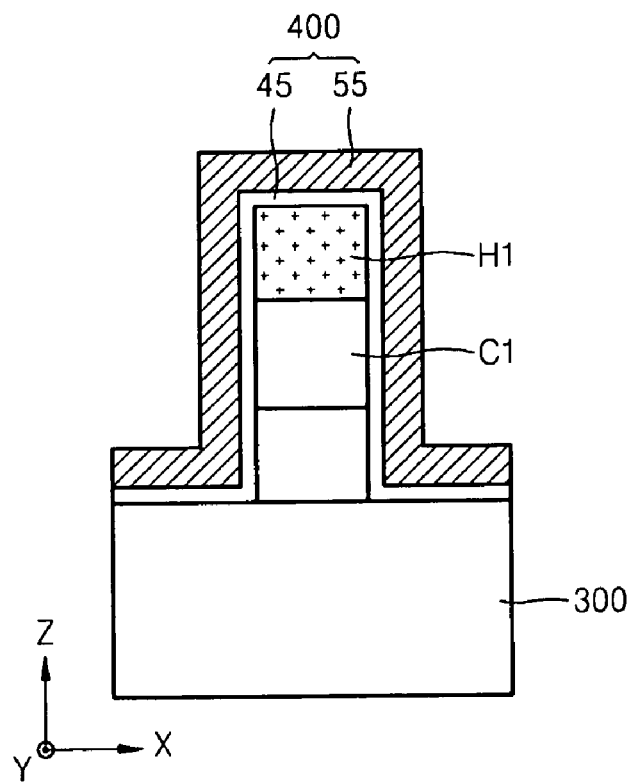
FIG. 4 is a cross-sectional view taken along line II-II' of FIG. 2.

FIG. 2 is a perspective view of a capacitorless dynamic random access memory (DRAM) according to example embodiments. FIG. 3 is a cross-sectional view taken along line I-I' of FIG. 2. FIG. 4 is a cross-sectional view taken along line II-II' of FIG. 2.

Referring to FIGS. 2 and 4, a semiconductor layer 310 may be disposed over a substrate 300, and the semiconductor layer 310 may be separated from the top surface of substrate 300 by a given distance. The substrate 300 may be a single crystal Si substrate, and the semiconductor layer 310 may be an epitaxial Si layer, for example. The semiconductor layer 310 may include a source region S1, a drain region D1, and a channel region C1. The source region S1 and the drain region D1 may be n+ regions. The source region S1 and the drain region D1 may be separated by the channel region C1, which may be disposed between the source region S1 and the drain region D1. The channel region C1 may be a p– region or an intrinsic semiconductor region. The channel region C1 may protrude over the source region S1 and the drain region D1 in a Z-axis direction. For example, the channel region C1 may be about 20 nm higher than the source region S1 and the drain region D1. A charge reserving layer H1 may be disposed on the channel region C1. Since the channel region C1 protrudes over the source region S1 and the drain region D1, the charge reserving layer H1 may be separated from the source region S1 and the drain region D1. The valence band of the charge reserving layer H1 may be higher than the valence band of the channel region C1. The charge reserving layer H1 may be a p-type semiconductor layer having a doping density higher than the channel region 1, for example a p+ semiconductor layer. In example embodiments where the valence band of the charge reserving layer H1 is higher than the valence band of the channel region C1, holes may be accumulated in the charge reserving layer H1. When the volume of the charge reserving layer H1 is increased, for example by increasing the height thereof, the storage capacity of the charge reserving layer H1 may be increased, and the data retention time in the charge reserving layer H1 may be extended. Additionally, since the charge reserving layer H1 is separated from the source region S1 and the drain region D1, the deterioration of the data retention characteristics of the capacitorless DRAM due to junction leakage currents may be prevented. Accordingly, the data retention characteristics of example embodiments of capacitorless DRAM may be improved.

A gate 400 may be disposed on the substrate 300, and may contact the channel region C1 and the charge reserving layer H1. The gate 400 may include a gate insulating layer 45 and a gate conductive layer 55 sequentially stacked on the substrate 300, the channel region C1, and the charge reserving layer H1. The gate 400 may cover side surfaces of the channel region C1 and side surfaces and a top surface of the charge reserving layer H1. Example embodiments provide that both side surfaces of the channel region C1 and the charge reserving layer H1 may be parallel to a Y-Z plane. In such example embodiments, the gate 400 may be disposed on both side surfaces of the channel region C1 and both side surfaces and the top surface of the charge reserving layer H1, and the gate 400 may have increased controlling ability.

An interlayer insulating layer may be disposed on the substrate 300, and may cover the semiconductor layer 310 and the gate 400 (not shown in FIGS. 2 through 4). At least a portion of the space between the substrate 300 and the semiconductor layer 310 may be filled with the interlayer insulating layer. When a portion of the space between the substrate 300 and the semiconductor layer 310 is not filled with an appropriate material, or not filled at all, example embodiments of the capacitorless DRAM may be structurally stable because the interlayer insulating layer may support the semiconductor layer 310 and the semiconductor layer 310 may be in contact with the gate 400 and the charge reserving layer H1.

Data may be written or erased using example embodiments by accumulating excess holes in the charge reserving layer H1 or removing excess holes accumulated in the charge reserving layer H1, respectively. Example embodiments of the process of accumulating the excess holes in the charge reserving layer H1 may include a first mechanism and a second mechanism. In the first mechanism, pairs of electro-holes may be generated by the impact of electrons, for example. In the second mechanism, holes may be generated by the tunneling of electrons, for example. The state in which the excess holes are accumulated in the charge reserving layer H1 may be regarded as writing the data '1'.

The state in which the excess holes are removed from the charge reserving layer H1, or the state in which excess electrons are present in the charge reserving layer H1, may be regarded as writing the data '0'. The electrical resistance of the channel region C1 may vary according to the data written in the charge reserving layer H1. Accordingly, by measuring the electrical resistance of the channel region C1, the data written in the charge reserving layer H1 may be read.

Figure 5:
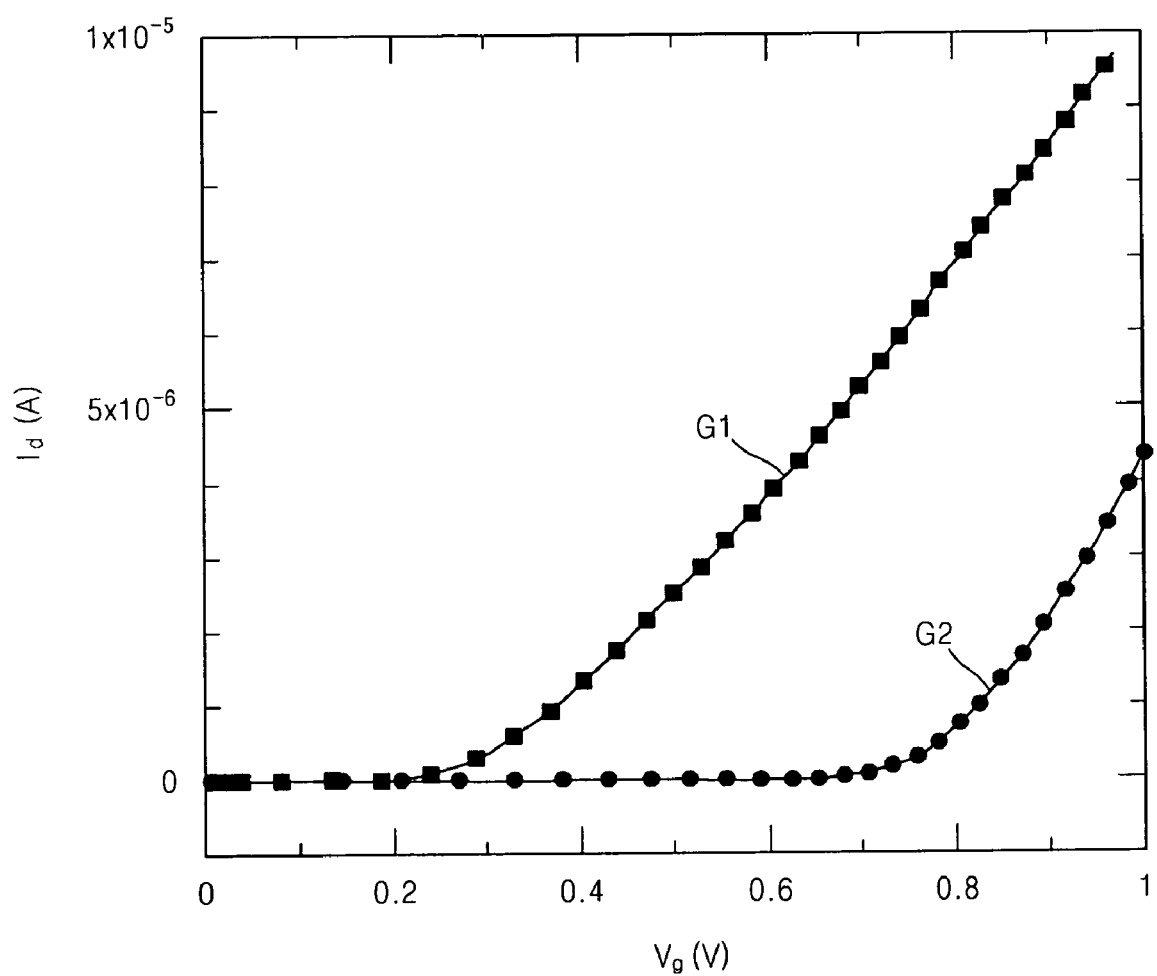
FIG. 5 is a graph showing a current-voltage characteristic of the capacitorless DRAM according to example embodiments.

FIG. 5 is a graph showing a current-voltage characteristic of the capacitorless DRAM according to example embodiments.

The result of FIG. 5 is obtained by an experiment of example embodiments illustrated in FIG. 2. In the experiment, the length along a Y-axis direction and the height of the channel region C1 were 63 nm and 40 nm, respectively. The thickness of the charge reserving layer H1 along the Z-axis direction was 60 nm. In FIG. 5, the horizontal axis denotes a voltage that may be applied to the gate 400, hereinafter a gate voltage $V_g$, and the vertical axis denotes a drain current $I_d$.

In FIG. 5, a first curve G1 shows a current-voltage characteristic of the state in which excess holes may be accumulated in the charge reserving layer H1, that is, when data '1' may be written, hereinafter referred to as the state '1', and a second curve G2 shows a current-voltage characteristic of the state in which the excess holes may be removed from the charge reserving layer H1, that is, when data '0' may be written, hereinafter referred to as the state '0'.

In order to make the charge reserving layer H1 be in the state '1', a gate voltage $V_g$ of −2.5 V, a voltage applied to the drain region D1, hereinafter, a drain voltage $V_d$ of 1.0 V, and a voltage applied to the source region S1, hereinafter, a source voltage $V_s$, of 0 V, may be applied. The mechanism used for such writing operation follows example embodiments of the second mechanism. In order to make the charge reserving layer H1 be in the state '1' using the first mechanism, a gate voltage $V_g$ of 1.0 V, a drain voltage $V_d$ of 3.0 V, and a source voltage $V_s$ of 0 V may be applied. In order to make the charge reserving layer H1 be in the state '0', a gate voltage $V_g$ of 1.0 V, a drain voltage $V_d$ of −1.0 V, and a source voltage $V_s$ of 0 V may be applied. Example embodiments provide that the reduction of the valence band of the charge reserving layer H1 by making the charge reserving layer H1 be in the state '0' may remove the holes accumulated in the charge reserving layer H1.

As shown in FIG. 5, the change in the drain current $I_d$ may be measured while increasing the gate voltage $V_g$ from 0 V to 1 V. Referring to FIG. 5, as the gate voltage $V_g$ is increased over 0.25 V, it may be seen that the difference between the drain current $I_d$ in the state '1' and the drain current $I_d$ in the state '0' is gradually increasing. Also, when the gate voltage $V_g$ is about 0.8 V, the difference between the drain current Id in the state '1' and the drain current $I_d$ in the state '0' may be about 6.5 µA, which means that a sensing margin for a reading operation may be secured. The drain voltage $V_d$ during the reading operation may be set to be about 0.2 V.

Table 1 shows the measurements of the gate voltage $V_g$, the drain voltage $V_d$, and the source voltage $V_s$ to make the charge reserving layer H1 be in the state '1' or '0' according to example embodiments. In Table 1, 'READ' denotes voltages for reading the state of the charge reserving layer H1. Example embodiments provide that data may be erased by the same principle by which data is written. For example, by changing the state '1' of the charge reserving layer H1 into the state '0', data '1' written in the charge reserving layer H1 may be erased.

TABLE 1

|        | WRITE "1" | WRITE "0" | READ |
|--------|-----------|-----------|------|
| Vg (V) | −2.5      | 1.0       | 1.0  | 0.8 |
| Vd (V) | 1.0       | 3.0       | −1.0 | 0.2 |
| Vs (V) | 0         | 0         | 0    | 0   |

FIGS. 6A through 6H are perspective views of a method of manufacturing the capacitorless DRAM according to example embodiments.

Figure 6A:
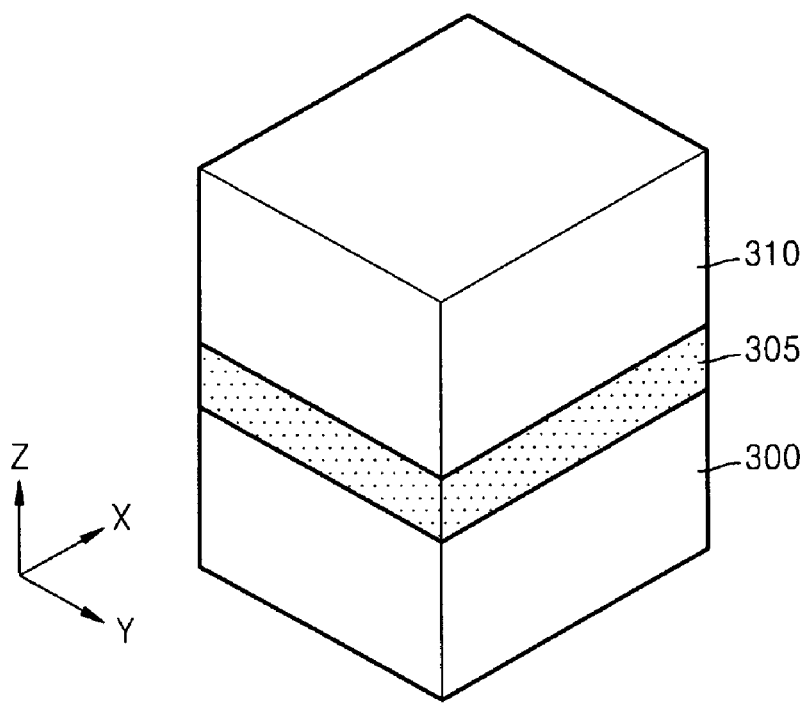
FIGS. 6A through 6H are perspective views of a method of manufacturing the capacitorless DRAM according to example embodiments.

Referring to FIG. 6A, the sacrificial layer 305 may be formed on the substrate 300. The substrate 300 may be a single crystal Si substrate, and the sacrificial layer 305 may be a SiGe layer formed on the substrate 300 using an epitaxial growth method. In alternative example embodiments, instead of forming the sacrificial layer 305 on the substrate 300 using the epitaxial growth method, the sacrificial layer 305 may be formed by implanting Ge ions in the upper portion of the substrate 300, and then annealing the upper portion to segregate the Ge ions.

The semiconductor layer 310 may be formed on the sacrificial layer 305. The semiconductor layer 310 may be a Si layer formed using an epitaxial growth method, and additional example embodiments provide that the semiconductor layer 310 may be doped with p-type impurities with a low density. Accordingly, the semiconductor layer 310 may be a p− semiconductor layer or an intrinsic semiconductor layer.

Figure 6B:
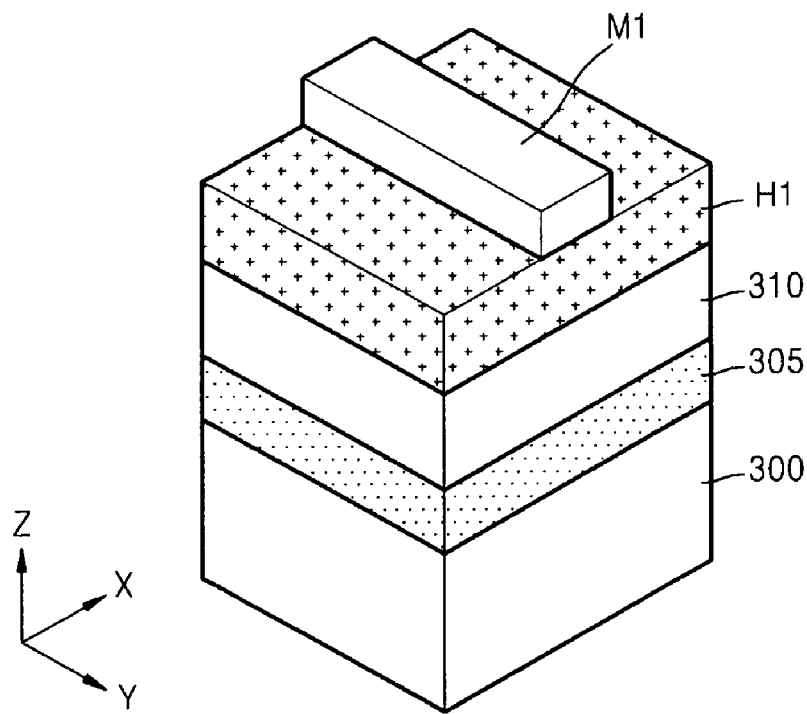

Referring to FIG. 6B, the upper portion of the semiconductor layer 310 may be changed into the charge reserving layer H1 by doping p-type impurities in the upper portion of the semiconductor layer 310 to a higher density. Alternative example embodiments provide that, instead of changing the upper portion of the semiconductor layer 310 into the charge reserving layer H1, a charge reserving layer may be formed on the semiconductor layer 310. Then, a first mask layer M1 may be formed on the charge reserving layer H1. Both top portions of the charge reserving layer H1 along the X-axis direction may be exposed by the first mask layer M1.

Figure 6C:
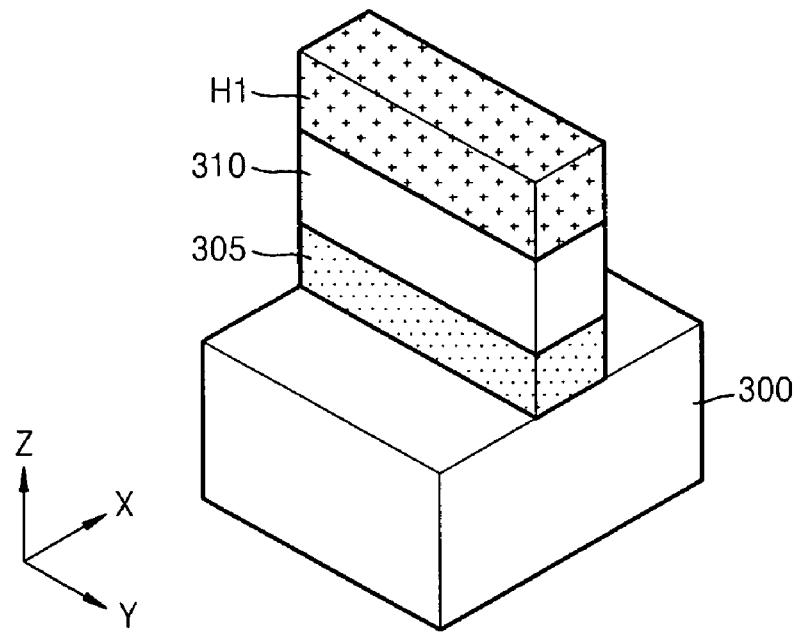

Referring to FIG. 6C, the charge reserving layer H1, the semiconductor layer 310, and the sacrificial layer 305 on both sides of the first mask layer M1 may be etched, and then the first mask layer M1 may be removed.

Figure 6D:
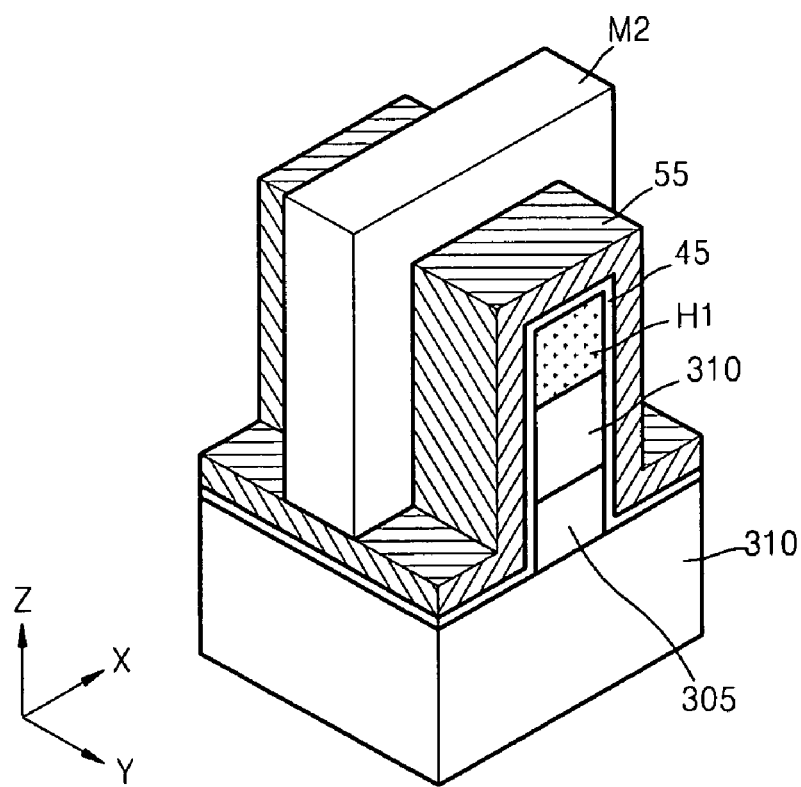

Referring to FIG. 6D, a gate insulating layer 45 may be formed on the exposed surfaces of the etched charge reserving layer H1, the semiconductor layer 310, the sacrificial layer 305, and the exposed top surface of the substrate 300. The gate insulating layer 45 may be formed of a silicon oxide by a thermal oxidization method, a chemical vapor deposition (CVD) method, or other method. When the gate insulating layer 45 is formed using the thermal oxidization method, for example, the sacrificial layer 305, which may be formed of SiGe, may have low oxidization power than the semiconductor layer 310, which may be formed of Si, and the thickness of the gate insulating layer 45 formed on the sacrificial layer 305 may be reduced. In other example embodiments, the gate insulating layer 45 may not be formed on the sacrificial layer 305.

A gate conductive layer 55 may be formed on the gate insulating layer 45 to constitute a two-layered gate material layer. A second mask layer M2 may be formed on the gate conductive layer 55 to at least partly cover the gate conductive layer 55. The second mask layer M2 may be a pattern layer extending parallel to the X-axis, across the center portion of the semiconductor layer 310. For example, both side portions of the gate conductive layer 55 may be exposed along the Y-axis direction by the second mask layer M2.

Figure 6E:
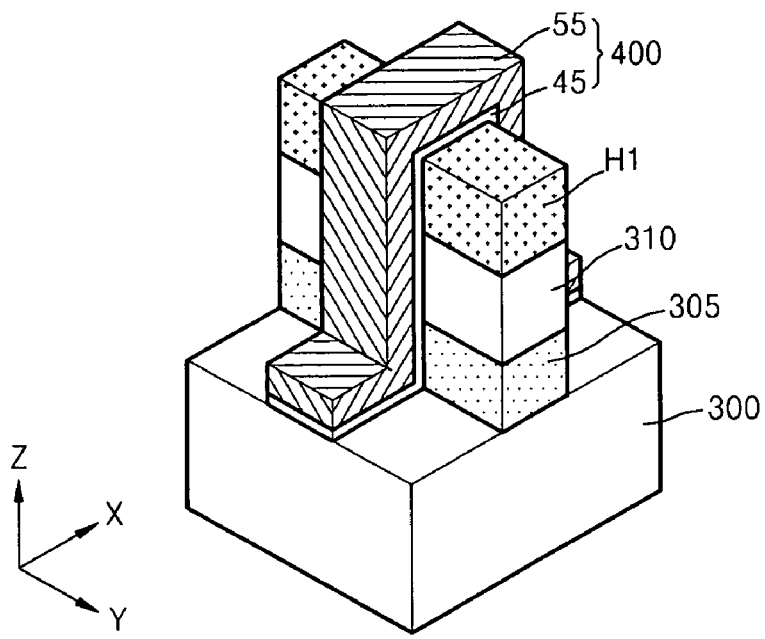

Referring to FIG. 6E, such exposed portions of the gate conductive layer 55 and the gate insulating layer 45 on both sides of the second mask layer M2 may be sequentially etched, and the second mask layer M2 may be removed. A gate 400 including the gate conductive layer 55 and the gate insulating layer 45 may be formed, and both ends of the charge reserving layer H1 may be exposed.

Figure 6F:
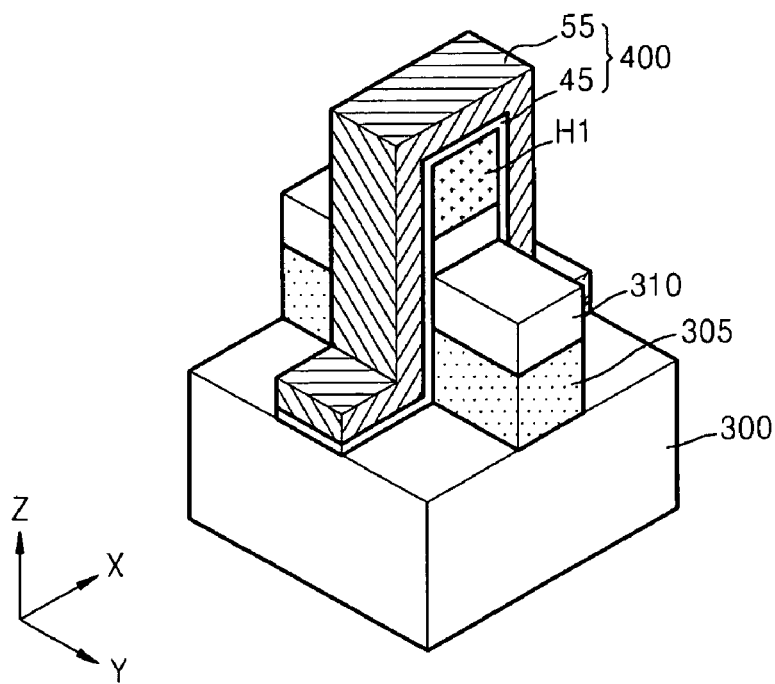

Referring to FIG. 6F, the gate 400 may be used as an etching mask to etch the exposed charge reserving layer H1 and a portion of the semiconductor layer 310.

Figure 6G:
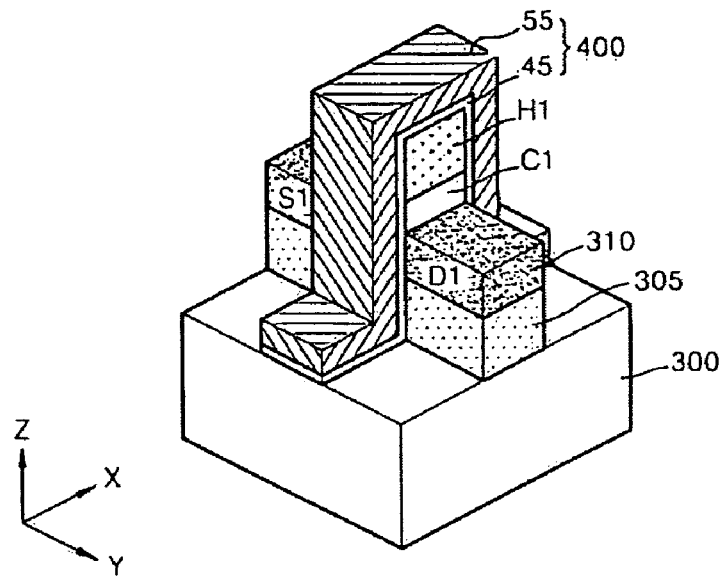

Referring to FIG. 6G, n-type impurities may be doped to a higher density in portions of the semiconductor layer 310 to form a source region S1 and a drain region D1. The semiconductor layer 310 between the source region S1 and the drain region D1 may be the channel region C1 and may protrude over the source region S1 and the drain region D1 along the Z-axis direction. An insulating spacer may be formed on both sidewalls along the Y-axis direction of the gate 400 and the charge reserving layer H1, and the exposed channel region C1 may be formed before forming the source region S1 and the drain region D1 (not shown in FIG. 6G).

Figure 6H:
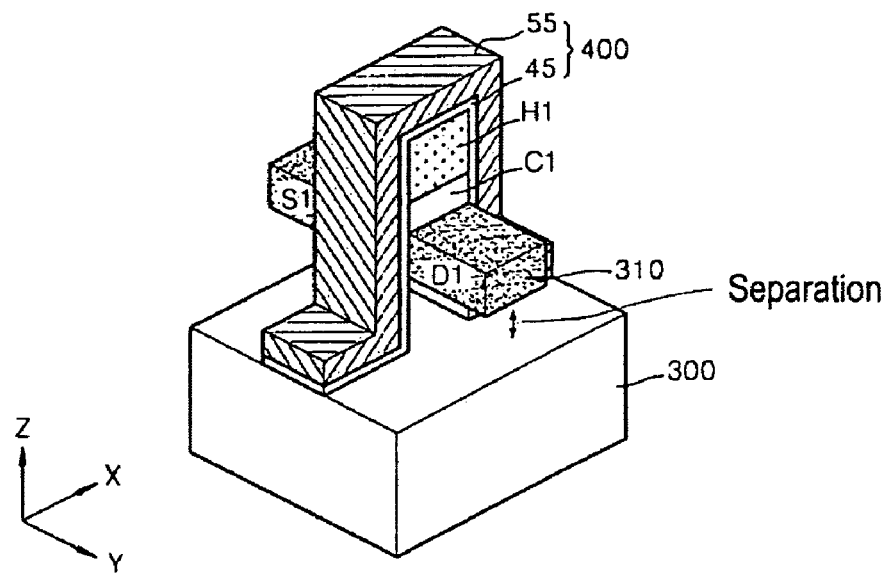

Referring to FIG. 6H, the sacrificial layer 305 may be removed using a selective etching method.

An interlayer insulating layer covering the semiconductor layer 310 and the gate 400 may be formed on the substrate 300 (not shown in FIG. 6H). The interlayer insulating layer may fill a portion of the space between the substrate 300 and the semiconductor layer 310.

A capacitorless DRAM according to example embodiments may be formed on an Si substrate instead of an SOI substrate, and manufacturing costs may be reduced.

According to example embodiments of a capacitorless DRAM, data may be stored in a charge reserving layer that is separated from a source region and a drain region, and the data retention characteristics of example embodiments may be improved. Additionally, example embodiments provide that the data retention time may be increased by increasing the thickness of the charge reserving layer.

In example embodiments of the capacitorless DRAM, a gate may be disposed on both side surfaces of the channel region, and on both side surfaces and the top surface of the charge reserving layer, and the controlling ability of the gate may be improved.

Example embodiments having thus been described, it will be obvious that the same may be varied in many ways. Such variations are not to be regarded as a departure from the intended spirit and scope of example embodiments, and all such modifications as would be obvious to one skilled in the art are intended to be included within the scope of the following claims.

What is claimed is:

1. A capacitorless dynamic random access memory (DRAM) comprising:
    a semiconductor layer separated from a top surface of a substrate and including a source region, a drain region, and a channel region, wherein the channel region protrudes over the source region and the drain region,
    a charge reserving layer on the channel region, and
    a gate on the substrate contacting the channel region and the charge reserving layer,
    wherein the gate directly contacts the substrate and covers both side surfaces of the channel region, and both side surfaces and a top surface of the charge reserving layer, the substrate not being a silicon-on-insulator (SOI) substrate.

2. The capacitorless DRAM of claim 1, wherein the charge reserving layer is separated from the source region and the drain region.

3. The capacitorless DRAM of claim 1, wherein the valence band of the charge reserving layer is higher than the valence band of the channel region.

4. The capacitorless DRAM of claim 3, wherein the channel region is an intrinsic semiconductor region or a p− semiconductor region.

5. The capacitorless DRAM of claim 1, wherein the doping density of the charge reserving layer is higher than the doping density of the channel region.

6. The capacitorless DRAM of claim 5, wherein the charge reserving layer is a p-type semiconductor layer.

7. The capacitorless DRAM of claim 6, wherein the charge reserving layer is a p+ semiconductor layer.

8. The capacitorless DRAM of claim 1, wherein the substrate is a Si substrate.

9. The capacitorless DRAM of claim 1, wherein the semiconductor layer is a Si layer.

10. A method of manufacturing a capacitorless DRAM comprising:
   forming a stack pattern including a sacrificial layer, a semiconductor layer, and a charge reserving layer sequentially stacked on a substrate, the substrate not being a silicon-on-insulator (SOI) substrate,
   forming a gate material layer covering the stack pattern on the substrate,
   exposing both ends of the stack pattern by patterning the gate material layer,
   removing the charge reserving layer, and the semiconductor layer to a given thickness from the both ends of the stack pattern,
   forming a source region and a drain region in the remaining portions of the semiconductor layer of the both ends of the stack pattern, and
   removing the sacrificial layer,
   wherein a channel region formed between the source region and the drain region protrudes over the source region and the drain region,
   wherein the forming of the gate material layer includes forming the gate to directly contact the substrate and cover both side surfaces of the channel region, and cover both side surfaces and a top surface of the charge reserving layer.

11. The method of claim 10, wherein forming the stack pattern comprises:
   providing the substrate including the sacrificial layer on an upper portion of the substrate,
   forming the semiconductor layer on the sacrificial layer,
   changing the upper portion of the semiconductor layer into the charge reserving layer, and
   patterning the charge reserving layer, the semiconductor layer, and the sacrificial layer.

12. The method of claim 10, wherein forming the stack pattern comprises:
   forming the substrate including the sacrificial layer on an upper portion of the substrate,
   forming the semiconductor layer on the sacrificial layer,
   forming the charge reserving layer on the semiconductor layer, and
   patterning the charge reserving layer, the semiconductor layer, and the sacrificial layer.

13. The method of claim 10, wherein the substrate is a Si substrate.

14. The method of claim 13, wherein the sacrificial layer is a SiGe layer.

15. The method of claim 14, wherein the sacrificial layer is formed by an epitaxial growth method.

16. The method of claim 14, wherein the sacrificial layer is formed by implanting Ge ions in an upper portion of the substrate and then annealing the upper portion implanted with the Ge ions.

17. The method of claim 14, wherein the semiconductor layer is formed of Si.

18. The method of claim 11, wherein the charge reserving layer is formed by implanting p-type impurities in the upper portion of the semiconductor layer.

19. The method of claim 10, wherein the charge reserving layer is separated from the source region and the drain region.

20. The method of claim 11, wherein the valence band of the charge reserving layer is higher than the valence band of a channel region formed between the source region and the drain region.

21. The method of claim 20, wherein the channel region is an intrinsic semiconductor region or a p– semiconductor region.

22. The method of claim 20, wherein the charge reserving layer is a p-type semiconductor layer.

23. A method of operating a capacitorless DRAM, comprising:
   providing the capacitorless DRAM including a semiconductor layer separated from a top surface of a substrate, and including a source region, a drain region, and a channel region, a charge reserving layer on the channel region, and a gate on the substrate contacting the channel region and the charge reserving layer, wherein the gate directly contacts the substrate and covers both side surfaces of the channel region, and both side surfaces and a top surface of the charge reserving layer, the substrate not being a silicon-on-insulator (SOI) substrate, wherein the channel region protrudes over the source region and the drain region, and
   applying a voltage to the source region, the drain region, and the gate.

24. The method of claim 23, wherein the voltage is one of a data writing voltage, a data reading voltage, and a data erasing voltage.

25. The method of claim 23, wherein the charge reserving layer is separated from the source region and the drain region.

26. The method of claim 23, wherein the valence band of the charge reserving layer is higher than the valence band of the channel region.

27. The method of claim 26, wherein the channel region is an intrinsic semiconductor region or a p– semiconductor region.

28. The method of claim 26, wherein the charge reserving layer is a p-type semiconductor layer.

* * * * *